(12) United States Patent
Winkler et al.

(10) Patent No.: US 9,657,222 B2
(45) Date of Patent: May 23, 2017

(54) SILICATE PHOSPHORS

(71) Applicant: Merck Patent GmbH, Darmstadt (DE)

(72) Inventors: Holger Winkler, Darmstadt (DE); Thomas Juestel, Witten (DE); Arturas Katelnikovas, Steinfurt (DE); Florian Baur, Muenster (DE)

(73) Assignee: MERCK PATENT GMBH, Darmstadt (DE)

( * ) Notice: Subject to any disclaimer, the term of this patent is extended or adjusted under 35 U.S.C. 154(b) by 243 days.

(21) Appl. No.: 14/396,401

(22) PCT Filed: Mar. 22, 2013

(86) PCT No.: PCT/EP2013/000872
§ 371 (c)(1),
(2) Date: Oct. 23, 2014

(87) PCT Pub. No.: WO2013/159857
PCT Pub. Date: Oct. 31, 2013

(65) Prior Publication Data
US 2015/0085472 A1    Mar. 26, 2015

(30) Foreign Application Priority Data

Apr. 24, 2012  (EP) .................................. 12002867

(51) Int. Cl.
| C09K 11/67 | (2006.01) |
| C09K 11/77 | (2006.01) |
| G02F 1/1335 | (2006.01) |
| F21K 9/64 | (2016.01) |
| H01L 33/50 | (2010.01) |

(52) U.S. Cl.
CPC ........ C09K 11/676 (2013.01); C09K 11/7706 (2013.01); C09K 11/7734 (2013.01);
(Continued)

(58) Field of Classification Search
CPC ............ C09K 11/7734; C09K 11/7764; C09K 11/7706; F21K 99/00; G02F 1/1335
See application file for complete search history.

(56) References Cited

U.S. PATENT DOCUMENTS

| 3,718,600 | A | * | 2/1973 | Tak | .................... | C09K 11/7734 |
| | | | | | | 252/301.4 F |
| 2010/0224828 | A1 | * | 9/2010 | Kuze | .................. | C09K 11/7734 |
| | | | | | | 252/301.4 F |
| 2015/0299565 | A1 | * | 10/2015 | Tetsufumi | .......... | C09K 11/7734 |
| | | | | | | 252/301.4 F |

FOREIGN PATENT DOCUMENTS

| GB | 1275167 A | 5/1972 |
| JP | 47001962 A | 8/1972 |

(Continued)

OTHER PUBLICATIONS

Blass et al, "Fluoresnce and Structure of Barium Zirconium Trisilicate", Journal of Solid State Chemistry, 2, 1970, pp. 105-108.*

(Continued)

*Primary Examiner* — Carol M Koslow
(74) *Attorney, Agent, or Firm* — Millen, White, Zelano & Branigan, P.C.

(57) ABSTRACT

The present invention relates to Eu—, Sm— or Pr-doped silicate compounds, to a process for the preparation thereof and to the use thereof as conversion phosphors. The present invention also relates to an emission-converting material comprising at least the conversion phosphor according to the invention and to the use thereof in light sources, in particular pc-LEDs (phosphor converted light emitting devices). The present invention furthermore relates to light sources, in particular pc-LEDs, and lighting units which contain a primary light source and the emission-converting material according to the invention.

18 Claims, 8 Drawing Sheets

(52) U.S. Cl.
CPC ............ *C09K 11/7764* (2013.01); *F21K 9/64* (2016.08); *G02F 1/133603* (2013.01); *G02F 2001/133614* (2013.01); *H01L 33/502* (2013.01)

(56) References Cited

FOREIGN PATENT DOCUMENTS

| JP | 48038550 | B1 | | 11/1973 |
|----|----------|----|---|---------|
| JP | 2006002043 | A | | 1/2006 |
| JP | 2008063549 | A | | 3/2008 |
| WO | WO 2014/006755 | | * | 1/2014 |

OTHER PUBLICATIONS

Wang et al, "BaZrSi3O9:Eu+2: a cyan-emitting phoshor with high quantum efficiency for white light-emitting doped", J. Mater. Chem., 21, 2011; pp. 10818-10822.*

Wang et al, "Synthesis, crystal stricture and photoluminescence of a novel blue-green emitting phoshor: BaHfSi3o9:Eu2+", J. Mater. Chem., 21, 2011; pp. 18261-18265.*

International Search Report dated Jul. 8, 2013 issued in corresponding PCT/EP2013/000872 application (pp. 1-3).

D.Y. Wang et al., "Synthesis, Crystal Structure, and Photoluminescence of a Novel Blue-Green Emitting Phosphor: BaHfSi3O9:Eu2+", Journal of Materials Chemistry, vol. 21 (2011) pp. 18261-18265.

D.Y. Wang et al., "BaZrSi3O9:Eu2+: A Cyan-Emitting Phosphor with High Quantum Efficiency for White Light-Emitting Diodes", Journal of Materials Chemistry, vol. 21 (2011) pp. 10818-10822.

Office Action in corresponding Japanese Appln. No. 2015-507399 dispatched on Dec. 14, 2016.

English machine translation of JP2006002043A published Jan. 5, 2006 to Daiden Co Ltd.

English machine translation of JP47001962A published on Aug. 22, 1972.

* cited by examiner

SILICATE PHOSPHORS

The present invention relates to Eu—, Sm— or Pr-doped silicate compounds, to a process for the preparation thereof and to the use thereof as conversion phosphors. The present invention also relates to an emission-converting material comprising at least the conversion phosphor according to the invention and to the use thereof in light sources, in particular pc-LEDs (phosphor converted light emitting devices). The present invention furthermore relates to light sources, in particular pc-LEDs, and lighting units which contain a primary light source and the emission-converting material according to the invention.

For more than 100 years, inorganic phosphors have been developed in order to adapt the spectra of emissive light screens, X-ray amplifiers and radiation or light sources in such a way that they meet the requirements of the respective area of application in as optimal a manner as possible and at the same time consume as little energy as possible. The type of excitation, i.e. the nature of the primary radiation source and the requisite emission spectrum, is of crucial importance here for the choice of host lattice and the activators.

In particular for fluorescent light sources for general lighting, i.e. for low-pressure discharge lamps and light-emitting diodes, novel phosphors are constantly being developed in order further to increase the energy efficiency, colour reproduction and stability.

There are in principle three different approaches to obtaining white-emitting inorganic LEDs (light-emitting diodes) by additive colour mixing:

(1) The RGB LEDs (red+green+blue LEDs), in the case of which white light is generated by mixing the light from three different light-emitting diodes which emit in the red, green and blue spectral region.

(2) The UV LED+RGB phosphor systems, in the case of which a semiconductor emitting in the UV region (primary light source) emits the light to an environment in which three different phosphors (conversion phosphors) which emit in the red, green and blue spectral region are excited.

(3) Complementary systems, in the case of which an emitting semi-conductor (primary light source) emits, for example, blue light, which excites one or more phosphors (conversion phosphor), which emit light, for example, in the yellow region. By mixing the blue and yellow light, white light is then generated. Alternatively, it is possible to use a phosphor mixture which emits green and red light.

Binary complementary systems have the advantage that they are capable of producing white light with only one primary light source and—in the simplest case—with only one conversion phosphor. The best-known of these systems consists of an indium aluminium nitride chip as primary light source, which emits light in the blue spectral region, and a cerium-doped yttrium aluminium garnet (YAG:Ce) as conversion phosphor, which is excited in the blue region and emits light in the yellow spectral region. However, improvements in the colour rendering index and the stability of the colour temperature are desirable.

In the case of the use of a blue-emitting semiconductor as primary light source, the binary complementary systems thus require a yellow conversion phosphor or green- and red-emitting conversion phosphors in order to reproduce white light. If, as an alternative, the primary light source used is a semiconductor which emits in the violet spectral region or in the near-UV spectrum, either an RGB phosphor mixture or a dichromatic mixture of two complementary light-emitting conversion phosphors must be used in order to obtain white light. In the case of the use of a system having a primary light source in the violet or UV region and two complementary conversion phosphors, light-emitting diodes having a particularly high lumen equivalent can be provided. A further advantage of a dichromatic phosphor mixture is the lower spectral interaction and the associated higher package gain.

In particular, inorganic fluorescent powders which can be excited in the blue and/or UV region of the spectrum are therefore gaining ever-greater importance today as conversion phosphors for light sources, in particular for pc-LEDs.

In the meantime, many conversion phosphors have been disclosed, for example alkaline-earth metal orthosilicates, thiogallates, garnets and nitrides, each of which are doped with $Ce^{3+}$ or $Eu^{2+}$.

However, there is a constant demand for novel conversion phosphors which can be excited in the blue or UV region and emit light in the visible region of the excitation spectrum.

The object of the present invention was therefore to provide novel materials with which radiation in the blue or UV region can be converted efficiently into radiation in the visible spectrum.

It is known that, on photon irradiation at 160 or 254 nm, hexagonal solid-state compounds of the formula $BaZr_{1-x}Hf_xSi_3O_9$ (x equal to 0 to 1) of the bazirite mineral type exhibit intense UV and blue luminescence having an emission maximum at 260 nm or 440 nm respectively. It has now surprisingly been observed by the inventors of the present application that, when some of the Zr or Hf ions in the mineral have been replaced by Eu, Pr or Sm ions, a cyan-emitting or red-emitting phosphor can be obtained which emits with a quantum yield of up to 90%.

The present invention therefore relates firstly to a compound of the formula I

$$(Ba_ySr_{1-y})Zr_{1-x}Hf_xSi_3O_9 \qquad (I),$$

where x is in the range from 0 to 1 and, independently thereof, y is in the range from 0 to 1, characterised in that some of the Zr or Hf ions of the compound of the formula I have been replaced by Eu, Pr or Sm ions. An alkali-metal ion is additionally present in the compound if Eu or Pr or Sm in the oxidation state +III has been incorporated.

An ion exchange of this type is also referred to as "doping". To this extent, the Eu, Pr or Sm ions in this application are also referred to as doping ions.

It is preferred in a variant of the invention for x to be equal to 0 or 1, i.e. the compound is either $(Ba_ySr_{1-y})ZrSi_3O_9$ or $(Ba_ySr_{1-y})HfSi_3O_9$. This variant of the invention has the advantage of simplified preparation of the materials, since the number of different starting materials can be kept small.

It is furthermore preferred for 0.1 to 20 mol % of the Zr or Hf ions respectively in the compound of the formula I according to the invention to have been replaced by Eu, Pr or Sm ions, more preferably 0.2 to 10 mol % and most preferably 0.3 to 5 mol %.

In an embodiment of the present invention, the Eu ions are present in divalent form, meaning that a tetravalent Zr or Hf ion has been replaced by two Eu ions. In this case, a cyan-emitting phosphor having a very high quantum yield of up to 90% is provided. FIGS. 3 and 5 show emission spectra for the compounds $BaZrSi_3O_9:Eu^{2+}$ and $BaHfSi_3O_9:Eu^{2+}$ according to the invention with different doping contents. The absorption is slightly red-shifted with increasing doping. In this way, the absorption maximum can be adjusted correspondingly depending on the doping content. These compounds which are preferred in accordance with the invention are particularly suitable for excitation in the near-UV region or in the blue region.

In a further embodiment, the tetravalent Zr or Hf ions of the compound of the formula I may have been replaced by trivalent metal ions selected from the group consisting of $Pr^{3+}$, $Sm^{3+}$, $Eu^{3+}$ and combinations thereof. Since the replaced Zr or Hf ions are tetravalent ions, univalent alkali-metal ions are also present in equimolar number to the trivalent doping ions for charge compensation. With respect to the alkali-metal ions, reference is made here to so-called co-doping. Possible alkali-metal ions to be employed are $Li^+$, $Na^+$, $K^+$, $Rb^+$ or $Cs^+$, in which $Na^+$ is preferred. FIGS. 6 to 8 show reflection spectra, excitation spectra and emission spectra for the compounds $BaZrSi_3O_9:Sm^{3+}/Na^+$, $BaHfSi_3O_9:Sm^{3}/Na^+$, $BaZrSi_3O_9:Eu^{3+}/Na^+$, $BaHfSi_3O_9:Eu^{3+}/Na^+$, $BaZrSi_3O_9:Pr^{3+}/Na^+$ and $BaHfSi_3O_9:Pr^{3+}/Na^+$ according to the invention. These compounds, which are likewise preferred in accordance with the invention, are particularly suitable for excitation in the UV region at 150-270 nm.

In addition, the emission colour of the compound of the formula I can also be influenced via the barium or strontium content. Thus, a high barium content ($0.7<y\leq1$) or even a compound which contains no strontium at all ($y=1$) may be preferred if the emission is to be in the cyan or green wavelength region. Conversely, a compound having a high strontium content ($0\leq y<0.3$) or even a barium-free compound ($y=0$) may be preferred if emission in the orange-red region is desired.

The present invention furthermore relates to a process for the preparation of a compound of the formula I, comprising the following process steps:
a) provision of a barium and/or strontium source, a zirconium and/or hafnium source, a silicon source and a source of one of the metals samarium, praseodymium or europium;
b) mixing of the sources provided in step a); and
c) sintering of the sources mixed in step b) at a temperature in the range from 1000 to 1700° C.

A barium or strontium source is taken to mean in accordance with the invention an inorganic or organic barium or strontium compound which is capable of conversion into barium oxide or strontium oxide on calcination. Possible barium or strontium sources are barium carbonate or strontium carbonate, barium sulfate or strontium sulfate, barium nitrate or strontium nitrate, barium oxalate or strontium oxalate, barium oxide or strontium oxide and barium halide or strontium halide, barium peroxide or strontium peroxide, in which barium carbonate or strontium carbonate is particularly preferred. It may be preferred here for barium and strontium already to be present in the "source" in the ratio to one another in which these alkaline-earth metal ions are also to be present in the compound of the formula I according to the invention.

A zirconium or hafnium source is taken to mean in accordance with the invention an organic or inorganic zirconium or hafnium compound which can be decomposed on calcination to give an oxide. In particular, oxides, oxysulfates, or oxalates of zirconium or hafnium, more preferably the oxides $ZrO_2$ or $HfO_2$, are employed here. It may also be preferred here for zirconium and hafnium already to be present in the "source" in the ratio to one another in which these metal ions are also to be present in the compound of the formula I according to the invention.

A silicon source is taken to mean in accordance with the invention an inorganic or organic silicon source, where an inorganic silicon source is again preferred here. Silicon dioxide is particularly preferably employed as silicon source here.

The source of one of the metals samarium, praseodymium or europium employed can be any inorganic or organic compounds of these metals which contain these metals in divalent or trivalent form and can be converted into an oxide on calcination. Use can be made here, for example, of the oxides, oxalates, acetates, nitrates, sulfates or carbonates. Particular preference is given to sources of these metals in which the metals are present in trivalent form. Especial preference is given here to the use of the oxides of samarium, praseodymium or europium, even more preferably $Sm_2O_3$, $Pr_2O_3$ and $Eu_2O_3$.

The sources of barium or strontium, zirconium or hafnium, silicon and the metals samarium, praseodymium or europium provided are mixed vigorously with one another in step b). The mixing is preferably carried out in a mortar, in which a grinding agent, such as, for example, acetone, is preferably additionally added. It is furthermore preferred for a borate salt (for example an alkali-metal borate, such as $Na_2B_4O_7$) or boric acid to be added as sintering aid during the step of mixing the above-mentioned sources.

After the mixing of the components in step b), the powder is preferably dried in a temperature range from 100 to 300° C. and subsequently subjected to a temperature treatment in the range from 1000 to 1700° C., more preferably 1200 to 1600° C.

If doping with a divalent doping ion, preferably $Eu^{2+}$, in the compound of the formula I is desired, the temperature treatment is preferably carried out for 2 to 4 h. If a source of the metals europium, samarium or praseodymium in which the metals are present in their trivalent form is employed for this purpose in step a) of the process according to the invention, the temperature treatment is preferably carried out in a reducing atmosphere. The reductive conditions here are established, for example, using carbon monoxide, forming gas, hydrogen or at least vacuum or an oxygen-deficiency atmosphere, preferably in a stream of nitrogen, preferably in a stream of $N_2/H_2$ and particularly preferably in a stream of $N_2/H_2/NH_3$. It is particularly preferred to prepare firstly an atmosphere comprising carbon monoxide and subsequently an atmosphere comprising forming gas during the temperature treatment. If a source of the metals europium, samarium or praseodymium in which the metals are present in their divalent form is employed, it is not necessary for the temperature treatment to be carried out in a reducing atmosphere; however, it is preferred to work under a protective-gas atmosphere (for example Ar, He, Ne or $N_2$).

If doping with a trivalent doping ion in the compound of the formula I is desired, it is not necessary for the temperature treatment to be carried out in a reducing atmosphere. Here, the temperature treatment can preferably be carried out in air for preferably 2 to 4 h.

As already mentioned above, the compounds of the formula I according to the invention doped with a trivalent doping ion contain an alkali-metal ion for charge compensation. It is therefore preferred for an inorganic alkali-metal compound, preferably an alkali-metal salt, such as alkali-metal carbonate, alkali-metal sulfate or alkali-metal chloride, more preferably alkali-metal carbonate and most preferably sodium carbonate, additionally to be employed in step a) of mixing in the process according to the invention for the preparation of compounds of the formula I which contain a trivalent doping ion.

The sources employed in step a) of the process according to the invention are weighed out in a ratio to one another with respect to the molar content of the metals such that the molar ratio corresponds to the desired ratio in the end product (compound of the formula I).

The sintering aid is preferably added in an amount in the range from 0 to 8 mol %, based on the total amount of all sources employed in step a) of the process according to the invention.

The compound of the formula I is obtained in the form of particles by the process according to the invention through the sinter cake being ground with grinding beads, sieved and subsequently classified. The compound of the formula I according to the invention is preferably in the form of particles. The particles preferably have a particle size in the range from 50 nm to 30 μm and more preferably from 1 μm to 20 μm. The particles of the compound of the formula I can also have a surface which carries functional groups which facilitate chemical bonding to surrounding binders comprising, for example, epoxy or silicone resin and/or glasses or plastics, such as acrylates, polycarbonates. These functional groups can be esters bonded, for example, via oxo groups, or other derivatives which are able to form links with constituents of the binders. Such surfaces have the advantage that homogeneous mixing of the phosphors into the binder is facilitated. Furthermore, the rheological properties of the phosphor/binder system and also the pot lives can thereby be adjusted to a certain extent. Processing of the mixtures can thus be simplified.

The present invention furthermore relates to the use of the compound of the formula I as phosphor, in particular as conversion phosphor.

In the present application, the term "conversion phosphor" is taken to mean a material which absorbs radiation in a certain wavelength region of the electromagnetic spectrum, preferably in the blue or UV region, in particular in the near-UV region, and emits visible light in another wavelength region of the electromagnetic spectrum.

The present invention furthermore relates to an emission-converting material comprising a compound of the formula I according to the invention. The emission-converting material may consist of the compound of the formula I and in this case would be regarded as equivalent to the term "conversion phosphor" defined above.

However, it is preferred for the emission-converting material according to the invention to comprise further conversion phosphors in addition to the conversion phosphor according to the invention. In this case, the emission-converting material according to the invention comprises a mixture of at least two conversion phosphors, where one of them is a compound of the formula I. It is particularly preferred for the at least two conversion phosphors to be phosphors which emit light of wavelengths which are complementary to one another. If the conversion phosphor according to the invention is, for example, a cyan-emitting phosphor (divalent Eu), this is preferably employed in combination with an orange-emitting conversion phosphor. Alternatively, the cyan-emitting conversion phosphor according to the invention can also be employed in combination with (a) green- and red-emitting conversion phosphor(s). If the conversion phosphor according to the invention is a red-emitting phosphor (trivalent dopant), this is preferably employed with (a) cyan- and green-emitting phosphor(s). It is thus particularly preferred for the conversion phosphor according to the invention to be employed in combination with one or more further conversion phosphors in the emission-converting material according to the invention, which then together preferably emit white light.

Thus, for example, a cyan-emitting conversion phosphor according to the invention can be employed in combination with $(Sr,Ca)_2SiO_4$:Eu as further conversion phosphor. FIG. 1 shows a colour diagram with the colour values of $BaZrSi_3O_9$:$Eu^{2+}$ and $BaHfSi_3O_9$:$Eu^{2+}$ and of $(Sr,Ca)_2SiO_4$:Eu as orange emitter.

The further conversion phosphors are preferably selected from the group consisting of sulfides, silicates, aluminates, borates, nitrides, oxynitrides, siliconitrides and alumosiliconitrides which are doped with $Eu^{2+}$, $Ce^{3+}$ or $Mn^{2+}$. The following Table 1 lists diverse examples of such phosphors.

TABLE 1

Red-, orange-, yellow-, green- and cyan-emitting phosphors which can be used in combination with the phosphors claimed here.

| Composition | Emission colour | $\lambda_{max}$ [nm] |
|---|---|---|
| $LaAl(Si_{6-z}Al_z)-(N_{10-z}O_z)$:Ce | Cyan | 460-500 |
| $CaSi_2O_{2-z}N_{2+2/3z}$:Eu | Green | 534-562 |
| γ-AlON:Mn—Mg | Green | 512 |
| $(Ba_{1-x}Sr_x)_2SiO_4$:Eu | Green | 520-560 |
| $SrGa_2S_4$:Eu | Green | 535 |
| $SrSi_2N_2O_2$:Eu | Green | 535-554 |
| $SrAlSi_4N_7$:Eu | Cyan and red | 500, 632 |
| $Ba_2ZnS_3$:Ce, Eu | Cyan and red | 498, 655 |
| $LaSr_2AlO_5$:Ce | Yellow | 556 |
| $Tb_3Al_5O_{12}$:Ce | Yellow | 545-555 |
| $Sr_2Si_5N_8$:Ce | Yellow | 553 |
| $CaSi_2N_2O_2$:Eu | Yellow | 565 |
| $(Sr_{1-x}Ca_x)_2SiO_4$:Eu | Orange | 560-600 |
| MgS:Eu | Orange | 580 |
| $Sr_3SiO_5$:Eu | Orange | 570 |
| $Ca_2BO_3Cl$:Eu | Orange | 573 |
| Li-α-SiAlON:Eu | Orange | 573 |
| $CaAlSiN_3$:Ce | Orange | 580 |
| $SrLi_2SiO_4$:Eu | Orange | 562 |
| $Ca_2SiS_4$:Eu | Orange to red | 550, 660 |
| $Y_3Mg_2AlSi_2O_{12}$:Ce | Orange to red | 600 |
| $(Ca_{1-x-y}Sr_xBa_y)_2Si_5N_8$:Eu | Orange to red | 580-640 |
| $(Ca_{1-x}Sr_x)AlSiN_3$:Eu | Red | 630-650 |
| $Lu_2CaMg_2Si_3O_{12}$:Ce | Red | 605 |
| $Sr_3(Al_2O_5)Cl_2$:Eu | Red | 610 |
| $Sr_2Si_5N_8$:Eu | Red | 625 |
| $CaSiN_2$:Ce | Red | 625 |
| $SrSiN_2$:Eu | Red | 670-685 |
| $(Ca_{1-x}Sr_x)S$:Eu | Red | 610-655 |
| $SrSiO_5$:Ce, Li | Cyan to red | 465-700 |
| Ca-α-SiAlON:Eu | Cyan to red | 500-700 |
| $MgSiN_2$:Mn | Yellow to red | 550-800 |

In the context of this application, the term cyan light is applied to light whose intensity maximum is at a wavelength between 460 and 505 nm, the term green light is applied to light whose intensity maximum is at a wavelength between 505 and 545 nm, the term yellow light is applied to light whose intensity maximum is at a wavelength between 545 and 565 nm, the term orange light is applied to light whose intensity maximum is at a wavelength between 565 and 600 nm, and the term red light is applied to light whose maximum is at a wavelength between 600 and 670 nm.

If a conversion phosphor according to the invention is mixed with at least one further conversion phosphor, the ratio of conversion phosphor according to the invention to the further phosphor is preferably 20:1 to 1:20, particularly preferably 10:1 to 1:10 and especially preferably 5:1 to 1:5, based on the total weight of the phosphors.

The present invention furthermore relates to the use of the emission-converting material according to the invention in a light source.

The present invention furthermore relates to a light source which contains a primary light source and the emission-converting material according to the invention.

Here too, it may be especially preferred for the emission-converting material to comprise at least one further conversion phosphor in addition to the conversion phosphor according to the invention, so that the light source preferably emits white light or light having a certain colour point (colour-on-demand principle).

In a preferred embodiment, the light source according to the invention is a pc-LED. A pc-LED generally contains a primary light source and an emission-converting material. The emission-converting material according to the invention can for this purpose either be dispersed in a resin (for example epoxy or silicone resin) or, given suitable size ratios, arranged directly on the primary light source or remote therefrom, depending on the application (the latter arrangement also includes "remote phosphor technology"). The advantages of remote phosphor technology are known to the person skilled in the art and are revealed, for example, in the following publication: Japanese Journ. of Appl. Phys., Vol. 44, No. 21 (2005), L649-L651.

The primary light source can be a semiconductor chip, a luminescent arrangement based on ZnO, TCO (transparent conducting oxide), ZnSe or SiC, an arrangement based on an organic light-emitting layer (OLED) or a plasma or gas-discharge source, most preferably a semiconductor chip. Possible forms of light sources of this type are known to the person skilled in the art.

If the primary light source is a semiconductor chip, it is preferably an indium aluminium gallium nitride (InAlGaN) chip, in particular of the formula $In_iGa_jAl_kN$, where $0 \leq i$, $0 \leq j$, $0 \leq k$, and $i+j+k=1$.

As already mentioned, the emission-converting material according to the invention can, in particular for use in light sources, in particular pc-LEDs, also be converted into any desired outer shapes, such as spherical particles, flakes and structured materials and ceramics. These shapes are summarised under the term "mouldings". The mouldings are consequently emission-converting mouldings.

The production of a, for example, ceramic emission-converting moulding comprising the emission-converting material is preferably carried out analogously to the process described in DE 10349038. In this case, the compound of the formula I according to the invention is preferably subjected to isostatic pressing, optionally with a further material which serves as matrix, and applied directly, in the form of a homogeneous thin and non-porous flake, to the surface of a primary light source in the form of a chip. This has the advantage that no location-dependent variation of the excitation and emission of the conversion phosphor takes place, with the result that the LED fitted therewith emits a homogeneous light cone of constant colour and has high light output. The ceramic emission-converting moulding may, if necessary, be fixed to the chip substrate using a water-glass solution.

In a preferred embodiment, the ceramic emission-converting moulding has a structured (for example pyramidal) surface on the side opposite a semi-conductor chip. As much light as possible can thus be coupled out of the ceramic emission-converting moulding. The structured surface on the ceramic emission-converting moulding is preferably produced by the compression mould in the case of isostatic pressing having a structured press platen and thus embossing a structure into the surface. Structured surfaces are desired if the thinnest possible ceramic emission-converting mouldings or flakes are to be produced. The pressing conditions are known to the person skilled in the art (see J. Kriegsmann, Technische keramische Werkstoffe [Industrial Ceramic Materials], Chap. 4, Deutscher Wirtschaftsdienst, 1998). It is important that the pressing temperatures used are $\frac{2}{3}$ to $\frac{5}{6}$ of the melting point of the substance to be pressed.

Also possible, however, are embodiments for the application of the emission-converting material according to the invention to a chip as primary light source in which the emission-converting material is applied in silicone as a layer. The silicone here has a surface tension, meaning that the layer of the emission-converting material is not uniform at a microscopic level or the thickness of the layer is not entirely constant. However, this means that the efficacy of the layer comprising the conversion phosphors is not or at least not significantly restricted.

The invention furthermore relates to a lighting unit, in particular for the backlighting of display devices, which contains at least one light source according to the invention. Lighting units of this type are employed principally in display devices, in particular liquid-crystal display devices (LC displays), having backlighting. The present invention therefore also relates to a display device of this type.

In a variant of the invention, the optical coupling between the emission-converting material and the primary light source (in particular semiconductor chip) is preferably effected by a light-conducting arrangement. This makes it possible for the primary light source to be installed at a central location and to be optically coupled to the emission-converting material by means of light-conducting devices, such as, for example, optical fibres. In this way, it is possible to achieve lamps adapted to the lighting wishes which merely consist of one or more different conversion phosphors, which may be arranged to form a light screen, and an optical waveguide, which is coupled to the primary light source. In this way, it is possible to place a strong primary light source at a location which is favourable for electrical installation and to install lamps comprising emission-converting materials, which are coupled to the optical waveguides, at any desired locations without further electrical cabling, merely by laying optical waveguides.

The following examples and figures are intended to illustrate the present invention. However, they should in no way be regarded as limiting. All compounds or components which can be used in the preparations are either known and commercially available, or can be synthesised by known methods. It furthermore goes without saying that, both in the description and in the examples, the added amounts of the components in the compositions always add up to a total of 100%. Per cent data given should always be regarded in the given context. However, they usually always relate to the weight of the part-amount or total amount indicated.

Even without further comments, it is assumed that a person skilled in the art will be able to utilise the above description in the broadest scope. The preferred embodiments should therefore merely be regarded as descriptive disclosure which is absolutely not limiting in any way. The complete disclosure content of all applications and publications mentioned above and below is incorporated into this application by way of reference.

EXAMPLES

Example 1

Figure 2:
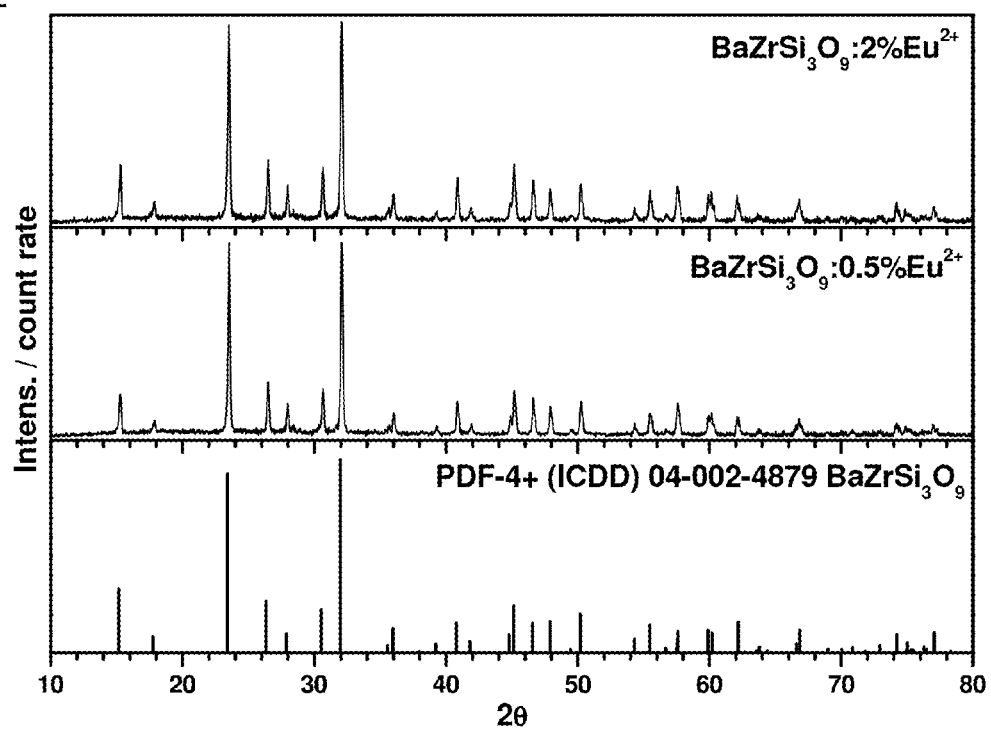
FIG. 2: X-ray powder diffraction patterns of BaZrSi$_3$O$_9$:Eu$^{2+}$ with 2 mol % and 0.5 mol % europium doping compared with undoped BaZrSi$_3$O$_9$ (measured using Cu Kai radiation).

Preparation of BaZrSi$_3$O$_9$: 0.5 mol % of Eu$^{2+}$ 1.7191 g (8.71 mmol) of BaCO$_3$, 1.0788 g (8.75 mmol) of ZrO$_2$, 1.5781 g (26.26 mmol) of SiO$_2$, 0.0077 g (0.022 mmol) of Eu$_2$O$_3$ and 0.1200 g (1.94 mmol) of H$_3$BO$_3$ are mixed thoroughly in an agate mortar with addition of a small amount of acetone as grinding agent. The powder is dried at 100° C. for 1 h, transferred into an aluminium oxide crucible and sintered at a temperature in the range from 1300 to 1500° C. for 2 to 4 h under a carbon monoxide atmosphere. In a second sintering step in a horizontal tubular furnace, the powder is subjected to a temperature of 1200° C. for 2 h under a stream of forming gas (10% of H$_2$). FIG. 2 shows the X-ray powder diffraction pattern of the compound prepared in this way.

Example 2

Preparation of BaZrSi$_3$O$_9$: 2 mol % of Eu$^{2+}$

This compound is prepared in the same way as the compound in Example 1, with the difference that the following compounds are weighed out at the beginning and then mixed: 1.6924 g (8.58 mmol) of BaCO$_3$, 1.0783 g (8.75 mmol) of ZrO$_2$, 1.5774 g (26.25 mmol) of SiO$_2$, 0.0308 g (0.088 mmol) of Eu$_2$O$_3$ and 0.1200 g (1.94 mmol) of H$_3$BO$_3$. The X-ray powder diffraction pattern of this compound is likewise shown in FIG. 2.

Figure 3:
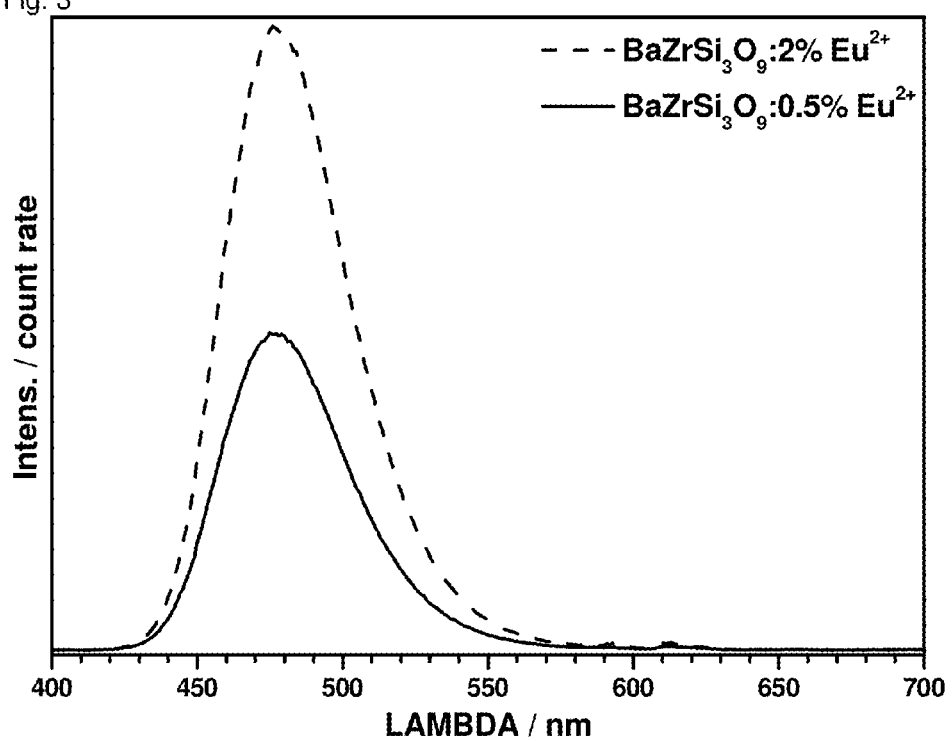
FIG. 3: Emission spectra of BaZrSi$_3$O$_9$:Eu$^{2+}$ ($\lambda_{ex}$=380 nm) with 2 mol % and 0.5 mol % europium doping.

FIG. 3 shows the emission spectra of the compounds prepared in Example 1 and Example 2.

Example 3

Preparation of BaHfSi$_3$O$_9$: 0.5 mol % of Eu$^{2+}$

Figure 4:
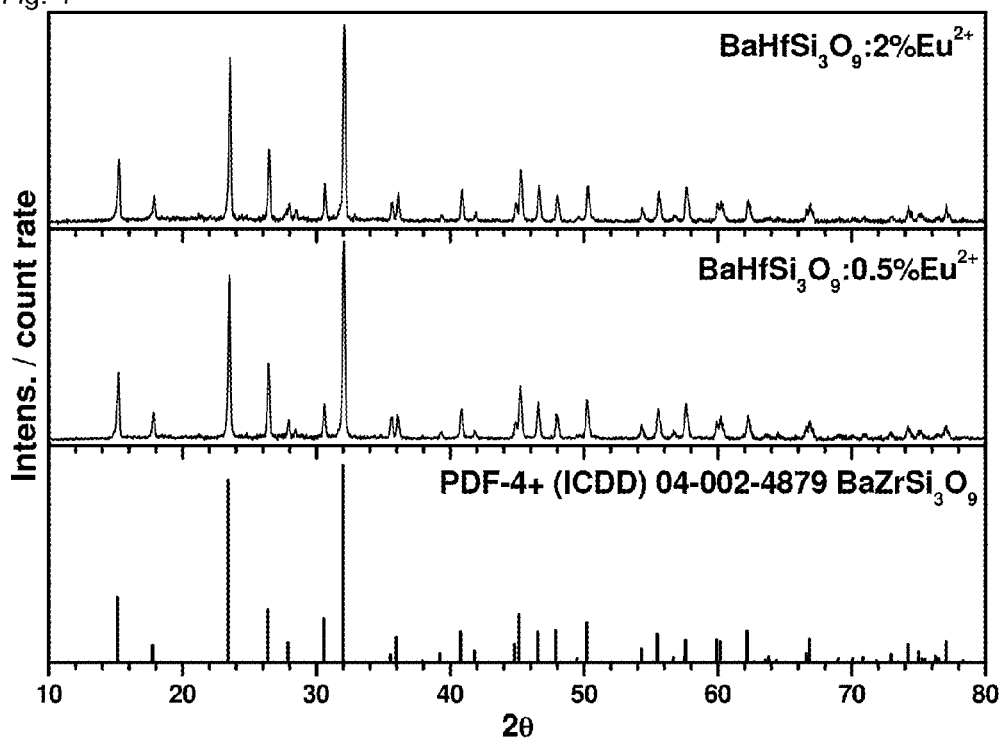
FIG. 4: X-ray powder diffraction patterns of BaHfSi$_3$O$_9$:Eu$^{2+}$ with 2 mol %
and 0.5 mol % europium doping compared with undoped BaHfSi$_3$O$_9$ (measured using Cu Kai radiation).

This compound is prepared in the same manner as in Example 1, with the difference that the following constituents are mixed: 1.4434 g (7.31 mmol) of BaCO$_3$, 1.5473 g (7.35 mmol) of HfO$_2$, 1.3250 g (22.1 mmol) of SiO$_2$, 0.0065 g (0.018 mmol) of Eu$_2$O$_3$ and 1.1200 g (1.94 mmol) of H$_3$BO$_3$. The X-ray powder diffraction pattern of this compound is shown in FIG. 4.

Example 4

Preparation of BaHfSi$_3$O$_9$: 2 mol % of Eu$^{2+}$

This compound is likewise prepared like the compound in Example 1, with the difference that the following constituents are mixed with one another: 1.4211 g (7.20 mmol) of BaCO$_3$, 1.5467 g (7.35 mmol) of HfO$_2$, 1.3245 g (22.0 mmol) of SiO$_2$, 0.0259 g (0.074 mmol) of Eu$_2$O$_3$ and 0.1200 g (1.94 mmol) of H$_3$BO$_3$. The X-ray powder diffraction pattern of this compound is likewise shown in FIG. 4.

Figure 5:
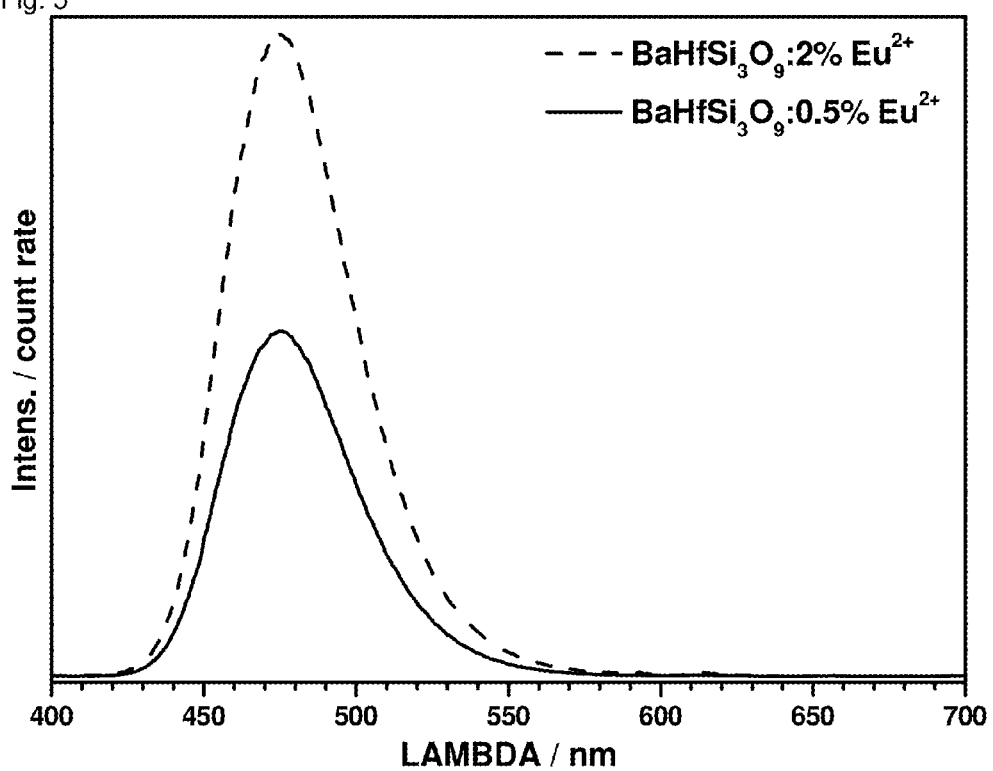
FIG. 5: Emission spectra of BaHfSi$_3$O$_9$:Eu$^{2+}$ ($\lambda_{ex}$=380 nm) with 2 mol % and 0.5 mol % europium doping.

FIG. 5 shows the emission spectra of the compounds prepared in Examples 3 and 4.

Example 5

Preparation of BaZrSi$_3$O$_9$: 1 mol % of Sm$^{3+}$, 1 mol % of Na$^+$ 1.6972 g (8.60 mmol) of BaCO$_3$, 1.0814 g (8.78 mmol) of ZrO$_2$, 1.5819 g (26.33 mmol) of SiO$_2$, 0.0153 g (0.044 mmol) of Sm$_2$O$_3$, 0.0047 g (0.044 mmol) of Na$_2$CO$_3$ and 0.1200 g (1.94 mmol) of H$_3$BO$_3$ are carefully mixed with one another in an agate mortar with addition of a small amount of acetone as grinding agent. The powder is dried at 100° C. for 1 h, transferred into an aluminium oxide crucible and sintered at 1300 to 1500° C. for 2-4 h in air.

Example 6

Preparation of BaHfSi$_3$O$_9$: 1 mol % of Sm$^{3+}$, 1 mol % of Na$^+$

This compound is prepared in the same way as in Example 5, with the difference that the following starting materials are mixed with one another: 1.4245 g (7.22 mmol) of BaCO$_3$, 1.5504 g (7.37 mmol) of HfO$_2$, 1.3277 g (22.10 mmol) of SiO$_2$, 0.0128 g (0.037 mmol) of Sm$_2$O$_3$, 0.0039 g (0.037 mmol) of Na$_2$CO$_3$ and 0.1200 g (1.94 mmol) of H$_3$BO$_3$.

Figure 6:
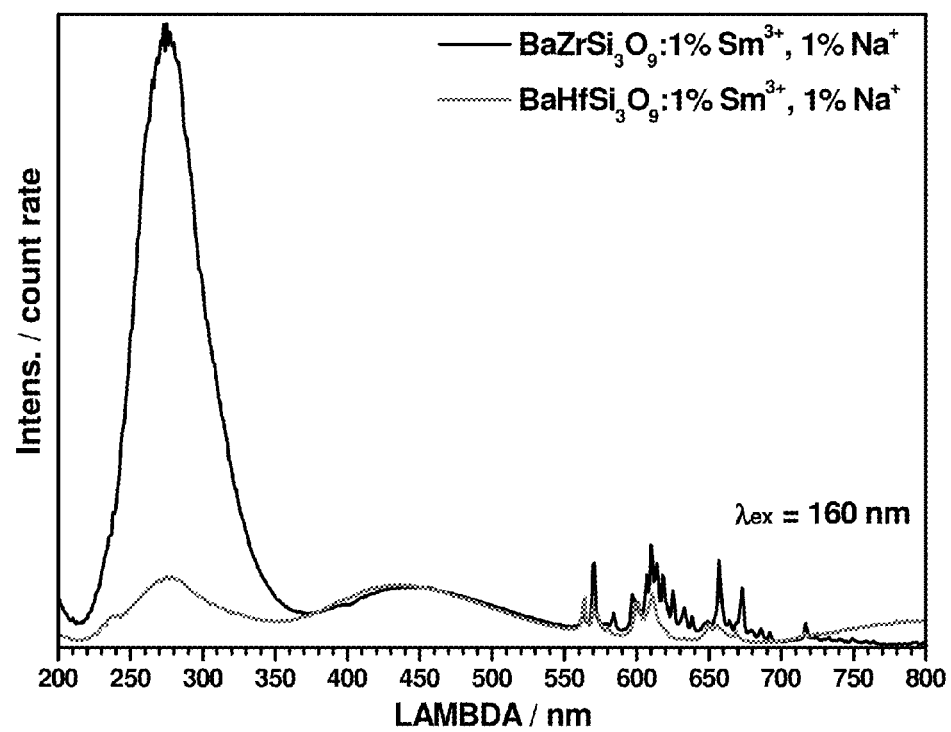
FIG. 6: Emission spectra of BaZrSi$_3$O$_9$:Sm$^{3+}$,Na$^+$ and BaHfSi$_3$O$_9$:Sm$^{3+}$,Na$^+$ ($\lambda_{ex}$=160 nm); in each case with 1 mol % doping.

FIG. 6 shows the emission spectra of the compounds prepared in Examples 5 and 6.

Example 7

Preparation of BaZrSi$_3$O$_9$: 1 mol % of Eu$^{3+}$, 1 mol % of Na$^+$

This compound is likewise prepared like the compound in Example 5, with the difference that the following starting compounds are mixed with one another: 1.6971 g (8.60 mmol) of BaCO$_3$, 1.0814 g (8.78 mmol) of ZrO$_2$, 1.5818 g (26.33 mmol) of SiO$_2$, 0.0154 g (0.044 mmol) of Eu$_2$O$_3$, 0.0047 g (0.044 mmol) of Na$_2$CO$_3$ and 0.1200 g (1.94 mmol) of H$_3$BO$_3$.

Example 8

Preparation of BaHfSi$_3$O$_9$: 1 mol % of Eu$^{3+}$, 1 mol % of Na$^+$

This compound is prepared in the same way as the compound under Example 5, with the difference that the following starting compounds are mixed with one another: 1.4244 g (7.22 mmol) of $BaCO_3$, 1.5504 g (7.37 mmol) of $HfO_2$, 1.3277 g (22.10 mmol) of $SiO_2$, 0.0130 g (0.037 mmol) of $Eu_2O_3$, 0.0039 g (0.037 mmol) of $Na_2CO_3$ and 0.1200 g (1.94 mmol) of $H_3BO_3$.

Figure 7:
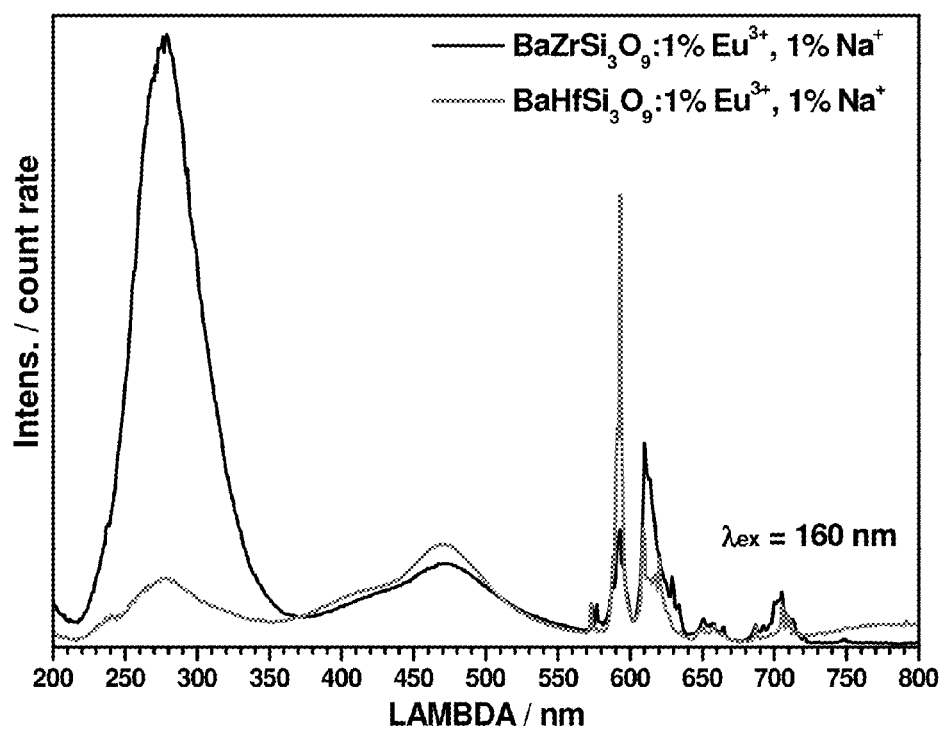
FIG. 7: Emission spectra of BaZrSi$_3$O$_9$:Eu$^{3+}$,Na$^+$ and BaHfSi$_3$O$_9$:Eu$^{3+}$,Na$^+$ ($\lambda_{ex}$=160 nm); in each case with 1 mol % doping.

FIG. 7 shows the emission spectra of the compounds prepared in Examples 7 and 8.

Example 9

Preparation of $BaZrSi_3O_9$: 0.5 mol % of $Pr^{3+}$, 0.5 mol % of $Na^+$

This compound is likewise prepared like the compound in Example 5, with the difference that the following starting compounds are mixed with one another: 1.7128 g (8.68 mmol) of $BaCO_3$, 1.0803 g (8.78 mmol) of $ZrO_2$, 1.5803 g (26.30 mmol) of $SiO_2$, 0.0159 g (0.022 mmol) of $Pr_2(C_2O_4)_3 \cdot 10 H_2O$, 0.0023 g (0.022 mmol) of $Na_2CO_3$ and 0.1200 g (1.94 mmol) of $H_3BO_3$.

Example 10

Preparation of $BaHfSi_3O_9$: 0.5 mol % of $Pr^{3+}$, 0.5 mol % of $Na^+$

This compound is prepared in the same way as the compound in Example 5, with the difference that the following starting compounds are mixed with one another: 1.4378 g (7.29 mmol) of $BaCO_3$, 1.5491 g (7.36 mmol) of $HfO_2$, 1.3266 g (22.08 mmol) of $SiO_2$, 0.0134 g (0.018 mmol) of $Pr_2(C_2O_4)_3 \cdot 10 H_2O$, 0.0020 g (0.018 mmol) $Na_2CO_3$ and 1.1200 g (1.94 mmol) of $H_3BO_3$.

Figure 8:
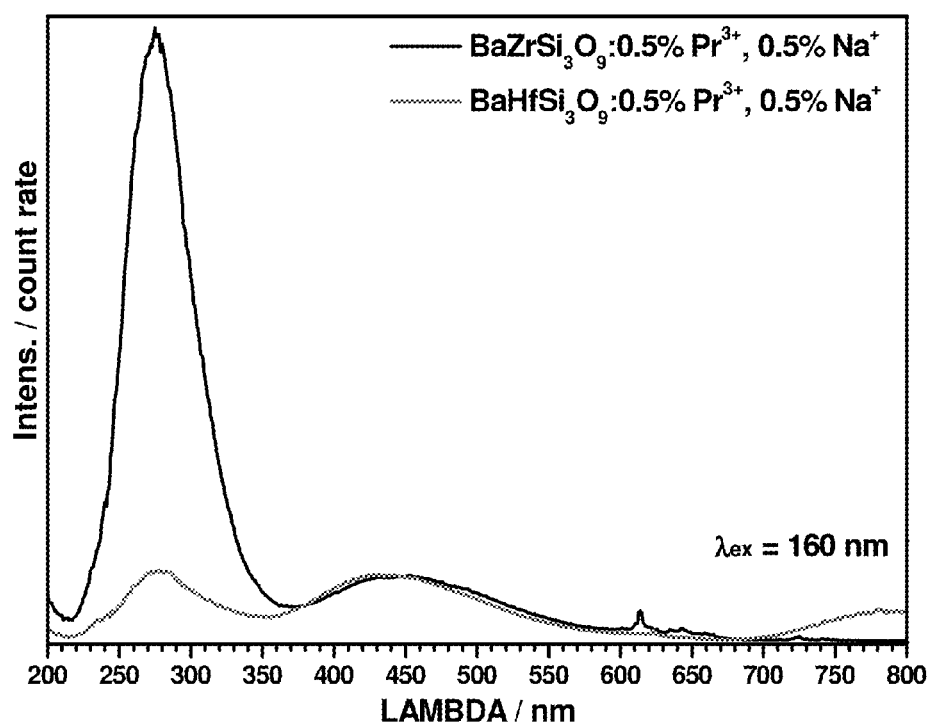
FIG. 8: Emission spectra of BaZrSi$_3$O$_9$:Pr$^{3+}$,Na$^+$ and BaHfSi$_3$O$_9$:Pr$^{3+}$,Na$^+$ ($\lambda_{ex}$=160 nm); in each case with 0.5 mol % doping.

FIG. 8 shows the emission spectra of the compounds prepared in Examples 9 and 10.

Example 11

Production of a pc-LED Using Compounds According to the Invention 1 g of a phosphor according to the invention from Examples 1 to 10 is dispersed with 10 g of an optically transparent silicone (OE 6550 from Dow Corning) in a Speedmixer. The silicone/phosphor mixture obtained in this way is applied to the chip of a blue semiconductor LED (Unicorn package from Mimaki Electronics, fitted with an InGaN chip emitting at 450 nm) with the aid of an automatic dispenser (CDS 6200 from Essemtech) and cured over the course of 1 h with supply of heat in a heating cabinet at 150° C.

Example 12

Test Results of the pc-LEDs Produced in Example 11

Figure 1:
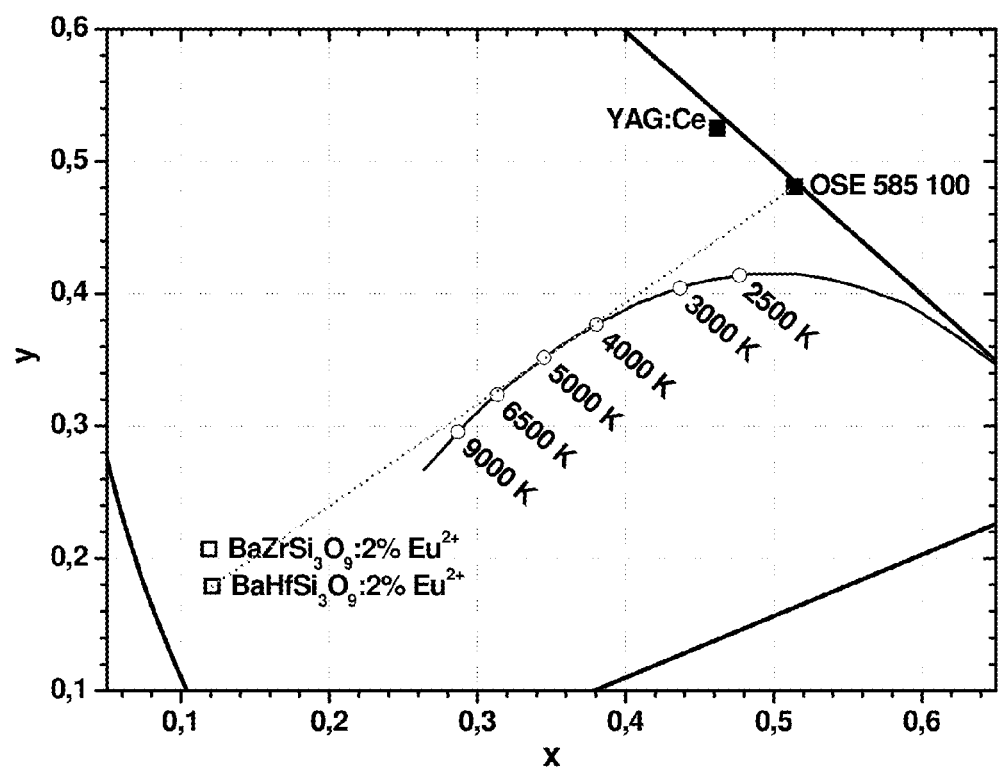
FIG. 1: CIE 1931 colour diagram with the colour values of $BaZrSi_3O_9:Eu^{2+}$ and $BaHfSi_3O_9:Eu^{2+}$ and of $(Sr,Ca)_2SiO_4:Eu$ as orange emitter.

The LED from Example 11 is contacted with current (350 mA) using a Keithley K2400 Sourcemeter, and the optical properties are determined using an Instrument Systems CAS 140 spectrometer, fitted with an integration sphere. The spectrometer software calculates the CIE 1931 x and y colour points of the LED from the emission spectrum obtained here. The corresponding values are plotted in the CIE diagram in FIG. 1.

The invention claimed is:

1. A compound of the formula I $$(Ba_y Sr_{1-y}) Zr_{1-x} Hf_x Si_3 O_9 \quad (I),$$

where x is in the range from 0 to 1 and, independently thereof, y is in the range from 0 to 1, wherein some of the Zr or Hf ions have been replaced by $Eu^{3+}$ ions, $Sm^{3+}$ ions or $Pr^{3+}$ ions, and an amount of alkali-metal ions equivalent to the $Eu^{3+}$ ions, $Sm^{3+}$ ions or $Pr^{3+}$ ions is present for charge compensation.

2. A compound according to claim 1, wherein 0.1 to 20 mol % of the Zr or Hf ions have been replaced by Eu, Pr or Sm ions.

3. A compound according to claim 2, wherein 0.2 to 10 mol %, of the Zr or Hf ions have been replaced by Eu, Pr or Sm ions.

4. A compound according to claim 1, wherein x is equal to 0 or 1.

5. A Compound according to claim 1, wherein $0 \leq y < 0.3$.

6. A compound according to claim 5, wherein y =0.

7. A compound according to claim 5, wherein $0.7 < y \leq 1$.

8. A compound according to claim 5, wherein y=1.

9. A process for the preparation of a compound according to claim 1, comprising:

a) providing a barium and/or strontium source, a zirconium or hafnium source, a silicon source and a source of one of on of the metals samarium, praseodymium or europium;

b) mixing of the sources provided in step a); and c) temperature treatment of the sources mixed in step b) in the range from 1000 to 1700° C.

10. An emission-converting material comprising a compound according to claim 1.

11. An emission-converting material according to claim 10, which additionally comprises at least one further conversion phosphor.

12. An emission-converting material according to claim 11, where the further conversion phosphor is a sulfide, a silicate, an aluminate, a borate, a nitride, an oxynitride, a siliconitride or a alumosiliconitride and said conversion phosphor is doped with $Eu^{2+}$, $Ce^{3+}$ or $Mn^{2+}$.

13. A light source comprising a primary light source and an emission-converting material according to claim 10.

14. A light source according to claim 13, wherein the primary light source is a luminescent indium aluminium gallium nitride.

15. A lighting unit, comprising at least one light source according to claim 13.

16. A display device comprising at least one lighting unit according to claim 13.

17. A liquid-crystal display device (LC display) comprising at least one lighting unit according to claim 15.

18. A backlighting of display devices, comprising at least one light source according to claim 13.

* * * * *